United States Patent [19]

Sprout, Jr.

[11] 4,393,093

[45] Jul. 12, 1983

[54] PREPARATION OF HIGH GAMMA (α)PHASE POLY(VINYLIDENE FLUORIDE) PIEZOELECTRIC MATERIALS

[75] Inventor: Oliver S. Sprout, Jr., Glenside, Pa.

[73] Assignee: Pennwalt Corporation, Philadelphia, Pa.

[21] Appl. No.: 272,823

[22] Filed: Jun. 12, 1981

[51] Int. Cl.³ .............................................. B05D 5/12
[52] U.S. Cl. ..................................... 427/40; 427/100; 264/22
[58] Field of Search .......................... 427/40, 100, 123; 264/22

[56] References Cited

U.S. PATENT DOCUMENTS 3,612,778 10/1971 Murphy.
3,664,605 2/1972 Sessler et al..
3,883,503 9/1974 Murayama et al..
3,912,830 10/1975 Murayama et al..
3,931,446 1/1976 Murayama et al..
3,985,914 10/1976 Sasaki et al..
4,095,020 6/1978 Prest et al..
4,239,608 12/1980 Pantelis.

FOREIGN PATENT DOCUMENTS 25751 3/1981 European Pat. Off..
51-46371 4/1976 Japan ..................................... 427/40

OTHER PUBLICATIONS

Cortili et al., *Spectrochimica Acta:* vol. 23A, pp. 2216-2218, 1967.
Osaki et al., *J. Pol. Sc. Pol. Phys. Ed.:* vol. 13, pp. 1071-1083, 1975.
Prest et al., *J. Appl. Phys.:* vol. 46, No 10, pp. 4136-4143, Oct. 1975.
Prest et al., *Org. Coating and Plastics Chemistry Preprints,* 175th ACS Meeting, vol. 38, pp. 334-339, Mar. 1978.
Prest et al., *J. Appl. Phys.,* vol. 49, pp. 5042-5047, Oct. 1978.
Kobayashi et al., *Macromolecules,* vol. 8, No. 2, pp. 158-171, 1975.

*Primary Examiner*—Norman Morgenstern
*Assistant Examiner*—Richard Bueker

[57] ABSTRACT

The piezoelectric and pyroelectric activity of vinylidene fluoride polymers is enhanced by treating the polymers with a glow discharge at a reduced pressure. The treatment is believed to convert a portion of the α phase crystal content of the polymers to the γ phase. Piezoelectric and pyroelectric elements are formed by metallizing a film of the treated polymer and poling the metallized film.

7 Claims, 3 Drawing Figures

PREPARATION OF HIGH GAMMA (α)PHASE POLY(VINYLIDENE FLUORIDE) PIEZOELECTRIC MATERIALS

BACKGROUND OF THE INVENTION

This invention relates generally to piezoelectric and pyroelectric polymers and more specifically to a process for treating vinylidene fluoride polymers in order to enhance their piezo and pyroelectric properties.

Certain polymers, including those of vinylidene fluoride, can be formed into films which are highly piezo- and pyroelectric. The existence of at least three crystalline phases ($\alpha, \beta$ and $\gamma$) in poly(vinylidene fluoride) (PVDF) polymers has been reported. Films containing the $\beta$ and/or $\gamma$ phases have the highest activity. It has been shown that a large thermally stimulated current is characteristic of $\gamma$ phase containing films, i.e., high pyroelectric activity results. The methods used to obtain the $\gamma$ phase of PVDF have included recrystallization of a melt or recrystallization from dimethyl sulfoxide (Cortili and Zerbi, Spectrochim Acta, 23 A, p. 2216, 1967) crystallization from a monochlorobenzene-dimethyl formamide mixture followed by filtration, vacuum drying for two weeks and annealing at 185° C. for 20 hours (Osaki & Ishida, *J. Polymer Sci, Polymer Phys. Ed.*, 13, p. 1071, 1975); inducing a time-temperature dependent crystal transition (Prest & Luca, *J. Appl. Phys.*, 46, (10), p. 4136, 1975); and washing PVDF in a methanol solution of a siloxane-oxyalkylene followed by pressing into a film which is slowly heated through the $\alpha$ phase to give a high $\gamma$ phase content (Prest et al., 175th A.C.S. Mtg. 3/12-17/78, Los Angeles, Organic Coating and Plastics Chemistry Preprints, 38, p. 334 and Prest et al., J. Appl. Phys., 49, (10) p. 5042, 1978; and Prest et al., U.S. Pat. No. 4,095,020). These methods are cumbersome and have disadvantages such as the presence of residual solvent, equipment cost and long processing times. I have now discovered a process for forming increased $\gamma$ phase containing PVDF materials having enhanced piezo- and pyroelectric activity from $\alpha$ phase containing PVDF. The process requires no solvents, can be carried out in conventional commercial equipment and can be easily integrated with existing equipment and procedures for forming piezo- and pyroelectric elements.

BRIEF SUMMARY OF THE INVENTION

In accordance with this invention, there is provided a process for increasing the piezo- and pyroelectric activity of vinylidene fluoride polymers comprising, treating the polymers with a glow discharge at a reduced pressure. Surprisingly, this treatment is believed to convert a portion of the $\alpha$ crystal content of the polymers to the $\gamma$ phase. A piezoelectric and/or pyroelectric element is formed by metallizing and poling a film of the treated polymer.

DETAILED DESCRIPTION

Figure 1:
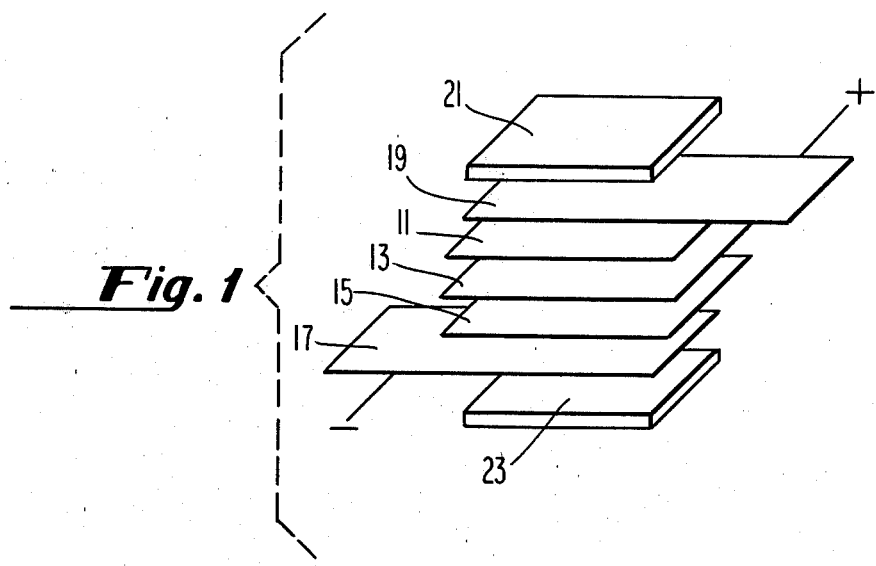
FIG. 1 is an exploded view of the configuration of the elements used in the polymer poling process.

Poly(vinylidene fluoride) polymers which contain $\alpha$ crystal phase material benefit from the process of the invention which provides an increase in the polymers' piezoelectric activity. The increase in activity is believed to be due to the conversion of $\alpha$ phase polymer to the $\gamma$ phase as shown by changes in the infrared spectra. Polymers and copolymers of vinylidene fluoride in the form of oriented and unoriented films, coatings, moldings and extrusions can be treated by the process of the invention. Copolymers which contain a large amount of $\beta$ crystal would not be expected to benefit from the process of the invention. For example, a copolymer of vinylidene fluoride and tetrafluoroethylene in a ratio of about 70/30 parts by weight has a large amount of $\beta$ crystal. Generally, polymers having $\alpha/\beta$ ratios of about 0.05 or greater (to about 3.0) would be expected to benefit by the process of the invention. The $\alpha/\beta$ ratio is the ratio of the IR absorbance at a frequency of 530 cm$^{-1}$ ($\alpha$ peak) over the IR absorbance at a frequency of 510 cm$^{-1}$ ($\beta$ peak). The term "vinylidene fluoride polymers" includes copolymers and terpolymers with other halogenated monomers such as, for example, tetrafluoroethylene, vinyl fluoride, trifluoroethylene, chlorotrifluoroethylene, and vinyl chloride where the vinylidene fluoride constitutes the major portion.

The method for converting $\alpha$ to $\gamma$ PVDF is conveniently carried out as a preliminary step in conjunction with the vacuum metallization of the polymer which is to be made into piezo- and/or pyroelectric elements. For example, a film or other form of the polymer is placed in a conventional vacuum metallizing chamber which is provided with electrodes and a power source for creating a glow discharge in the chamber such as is used to clean surfaces prior to metallizing. A glow discharge is created by evacuating the chamber to a pressure of from about 0.01 to 2 torr and providing a potential of up to about 10 KV to a wire electrode from an A.C. or D.C. power source. The polymer is then exposed to this glow discharge for a time sufficient to increase its piezo- and pyroelectric activity.

Exposure times of a few minutes (3–7 minutes) are sufficient to increase the polymer's piezo- and pyroelectric activity. Following the glow discharge treatment, the chamber pressure is adjusted for a conventional vacuum metallizing process and a metal film is deposited on the polymer to a thickness of from about 500 to 1,500 Å.

The treated polymers are poled by subjecting them to an electric field in order to provide an essentially permanently polarized piezo- and pyroelectric material. The poling process is carried out by subjecting the polymer to an electric field such as by placing it between electrodes and applying an electrical potential to the electrodes while heating the polymer.

The invention is further illustrated by, but is not intended to be limited to, the following examples.

EXAMPLE 1

A uniaxially oriented poly(vinylidene fluoride) film, having a thickness of about 0.8 mil, was placed in the vacuum chamber of a Model 428 Stokes vacuum metallizer which was equipped to provide a glow discharge in the chamber. The chamber was evacuated to a pressure of about 0.05 torr and a glow discharge was created in the chamber. The glow discharge treatment was continued for about 3 minutes at about 200 to 700 volts.

The vacuum was then adjusted to about $5 \times 10^{-5}$ torr and the film was metallized on both sides with aluminum, which was vaporized from a resistively heated holder, to a film thickness of about 1,000 Å.

Figure 2:
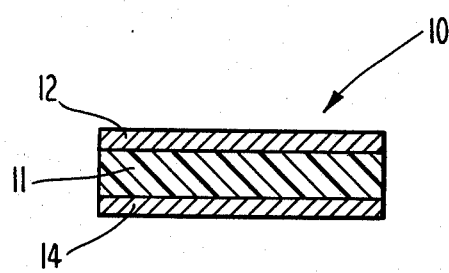
FIG. 2 is a sectional view showing a piezoelectric and/or pyroelectric element of the invention.

The glow discharge treated, aluminum metallized film was poled by placing it in a stack on top of two layers of untreated film with pieces of aluminum foil on each side of the stack. The foil extended out to serve as electrical connectors. The collation of films and foils was inserted between pieces of particle board stiffeners. The arrangement is illustrated in FIG. 1 where the metallized treated film 11 is placed with untreated films 13 and 15 between aluminum foils 17 and 19 and stiffeners 21 and 23. The films were poled with a field strength of 500 KV/cm for one hour while at a temperature of 98° C. and then for 50±5 minutes while the films were cooled to below 50° C. The piezoelectric activity of the pyro- and piezoelectric element 10 (FIG. 2), comprised of film 11 with aluminum layers 12 and 14, was found to be 21.1 pc/N (pico columbs/Newton) whereas an untreated sample of the same film, which was poled indentically in a comparable position in a similar stack had a much lower activity value of 12.6 pc/N. This demonstrates the superior result produced by the process of the invention.

EXAMPLE 2

In this example, three samples of glow discharged and metallized films were stacked for poling rather than having untreated films as the middle and bottom layers of the stack as was the case in Example 1. The greatest piezoelectric activity was acquired by the middle film, a little less by the upper film in the stack which was adjacent to the positive electrode, and very little by the bottom film. Differences in activity are believed to be due to differences in charge distribution throughout the stack. The activity in pc/N for each of the films in Examples 1 and 2 are given in Table 1.

Figure 3:
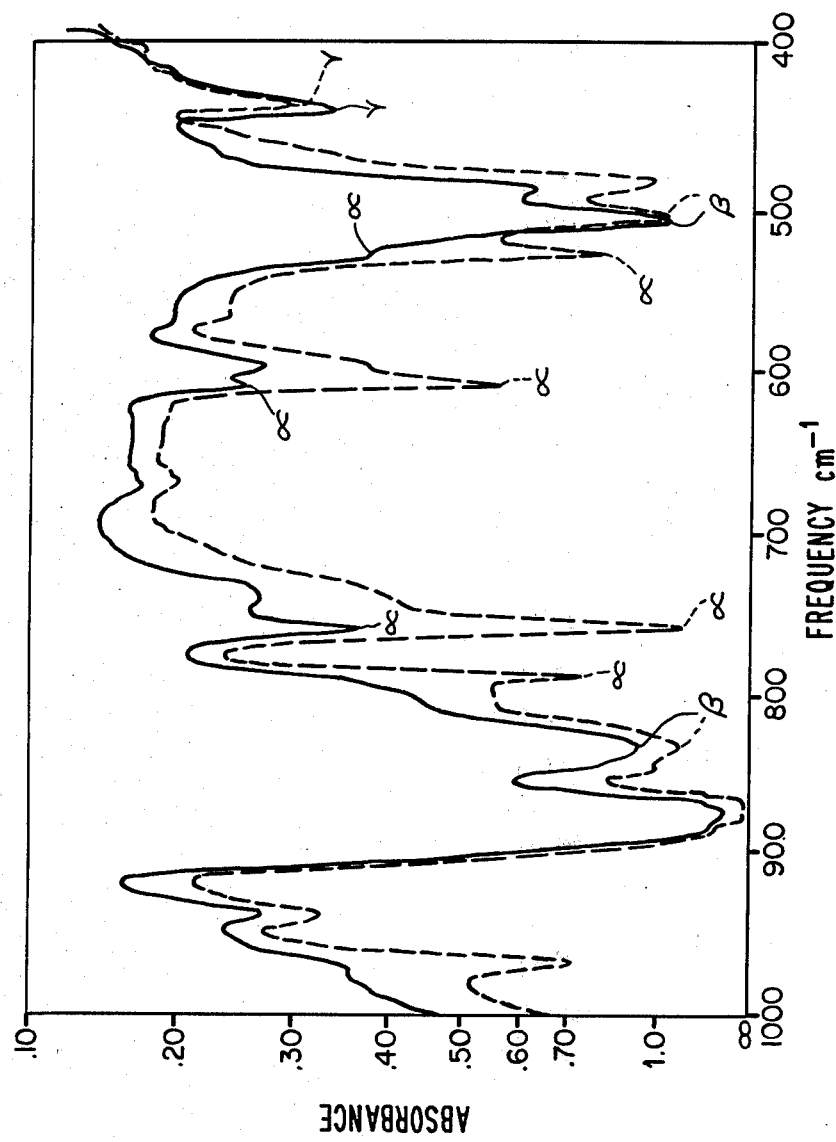
FIG. 3 contains the infrared spectra obtained from treated and untreated samples of poly(vinylidene fluoride) films.

The dashed line in FIG. 3 is the infrared spectrum of a PVDF film before glow discharge and metallization. The film was about 0.6 mil thick PVDF uniaxially oriented in the machine direction for which the draw ratio was 5.5 times and the $\alpha/\beta$ ratio 0.149. The main absorption peaks for the $\alpha$, $\beta$ and $\gamma$ phases are indicated in FIG. 3. Some $\gamma$ phase crystal is indicated to be present in the untreated film by the peak at about 430 cm$^{-1}$, probably as a consequence of the thermal history of the film. The solid line in FIG. 3 is the infrared spectrum of a sample of the same film after being treated with a glow discharge for seven minutes. The change in the absorption peaks compared to the spectrum of the untreated film show that the the $\alpha$ phase content decreased while that of the $\gamma$ phase increased and the $\beta$ phase remained essentially unchanged. A sample of the same film which was glow discharge treated, metallized with aluminum and an overcoating of copper and a sample of the same film which was glow discharge treated for three minutes and then coated with aluminum and stripped, gave absorption spectra similar to the treated unmetallized film. This shows that the metallization process did not affect the crystalline phase content of the films. A sample of the film which was treated only with the alkaline gel gave the same spectrum as the untreated film showing that the metal stripping process did not influence the spectra obtained from the metallized and stripped films.

More precise infrared studies were made to determine whether the quantity of each of the crystalline phases was increased or decreased by glow discharge. This was done by a modified infrared spectrophotometric method known as attenuated total reflectance (ATR). In this method, the infrared beam is limited to the surface layers of the film and is not transmitted through the film as in the method used previously. Additional speciments of the films characterized in FIG. 3 were examined by ATR. The intensities of the absorp-

TABLE 1

| Example | Top Film | COMPONENT DIMENSIONS W" × L" | | | | $d_{33}$ pC/N Film | | |
| --- | --- | --- | --- | --- | --- | --- | --- | --- |
| | | Films | Metal Faces on Top Film | Al Foil 1 mil | Board .25" | Top | Middle | Bottom |
| 1 | Untreated | 3.5 sq. | none | 3 × 6 | 3.5 sq. | 12.6 | 11.8 | 10.1 |
| 1 | Glow Discharged & Metallized | 3.5 × 7.25 | 2.75 × 6.25 | 2.75 × 10 | 3.5 × 6.5 | 21.1 | 8.4 | 8.4 |
| 2 | Glow Discharged & Metallized | 3.25 × 7.25 | 2.75 × 3 | 2.75 × 6 | 3.5 sq. | 16.9 | 19.4 | 2.3 |

EXAMPLE 3

In order to determine the change in crystal phase content of the glow discharge treated film, the crystal phases present in untreated film and films subjected to glow discharge, with or without subsequent metallization, were identified by infrared transmission spectra. Films which had been metallized were first stripped of their coating by applications of an alkaline gel for up to 30 minutes at ambient temperature, followed by water rinsing and drying. The gel contained 2% sodium hydroxide and 2% hydroxypropyl methyl cellulose as a thickener and adhering agent. The characteristic absorption peaks for the crystalline phases of the PVDF were identified by the data of Prest and Luca J. Appl. Phys. 46 (10), p. 4136 (1975) and Koboyashi et al., Macromolecules 8 (2), p. 158 (1975).

tion peaks in the spectra were determined by difference from a base line, and comparison of respective peak intensities before and after processing gave the change in intensity due to the glow discharge. Assignment of the crystal phases present was made on the basis of the observed absorption frequencies using the data of Kobayashi et al. The results are given in Table 2.

TABLE 2

| Observed Frequency cm$^{-1}$ | Absorption Intensity | | | Assigned Phase |
| --- | --- | --- | --- | --- |
| | Initial | After Glow Discharge | Change | |
| 410 | .164 | 0 | −.164 | $\alpha$ |
| 445 | .236 | .291 | +.055 | $\beta$ or $\gamma$ |
| 472 | .235 | .279 | +.044 | $\beta$ @ 468 $\gamma$ @ 483 |
| 488 | .733 | .455 | −.278 | $\alpha$ or $\gamma$ |
| 510 | .593 | .567 | −.026 | $\beta$ or $\gamma$ |
| 530 | .305 | .150 | −.155 | $\alpha$ |

TABLE 2-continued

| Observed Frequency cm$^{-1}$ | Absorption Intensity After Glow | | | Assigned Phase |
|---|---|---|---|---|
| | Initial | Discharge | Change | |
| 605 | .106 | .079 | −.027 | — |
| 616 | .230 | .066 | −.164 | α |
| 768 | .415 | .128 | −.287 | α |
| 800 | .286 | 0 | −.286 | α |
| 842 | — | — | — | — |
| 875 | — | — | — | — |
| 980 | .149 | .062 | −.087 | α |

An increase in absorption was found at frequencies of 445 and 472 cm$^{-1}$, indicating an increase in the crystal phase present, which was designated to be either β or γ phase. The α phase decreased. Since it has been found that induced transformations in the PVDF crystal system progress to the γ phase, Prest et al, 175th A.C.S. meeting, 3/12-17/78, Los Angeles, Organic Coatings and Plastics Chemistry Preprints, 38, p. 334., it is reasonable to believe that the observed absorption increase was due to an increase in γ content.

I claim:

1. A process for increasing the piezoelectric activity of a vinylidene fluoride polymer containing an α crystalline phase and having an α/β ratio of at least about 0.05 comprising treating the polymer with a glow discharge at reduced pressure to convert a portion of the α crystalline phase to γ crystalline phase and then poling the polymer in an electric field.

2. The process of claim 1 including the step of coating the polymer with a metal film.

3. The process of claim 2 wherein the treating and coating is carried out in the same vacuum chamber.

4. The process of claim 1 wherein the polymer is treated at a pressure of 0.01 to 2 torr for from at least about 3 minutes.

5. The process of claim 1 wherein the polymer is in the form of a film and, after the polymer is treated with the glow discharge, it is coated on each side with a metal film so as to form a piezoelectric element.

6. The process of claim 1 wherein the polymer is a poly(vinylidene fluoride) homopolymer.

7. The process of claim 1 wherein the the α/β ratio is from about 0.05 to 3.0.